(12) United States Patent
Brown et al.

(10) Patent No.: US 6,875,927 B2
(45) Date of Patent: Apr. 5, 2005

(54) HIGH TEMPERATURE DC CHUCKING AND RF BIASING CABLE WITH HIGH VOLTAGE ISOLATION FOR BIASABLE ELECTROSTATIC CHUCK APPLICATIONS

(75) Inventors: Karl Brown, San Jose, CA (US); Cheng-Hsiung (Matt) Tsai, Cupertino, CA (US); Donny Young, San Francisco, CA (US); Vineet Mehta, San Jose, CA (US); David Loo, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 287 days.

(21) Appl. No.: 10/095,351

(22) Filed: Mar. 8, 2002

(65) Prior Publication Data

US 2003/0169553 A1 Sep. 11, 2003

(51) Int. Cl.[7] .................................................. H01B 7/00
(52) U.S. Cl. ................................... 174/110 R; 174/120 R
(58) Field of Search .............................. 174/36, 110 R, 174/110 C, 113 R, 120 C, 120 R, 121 R, 122 R, 124 R

(56) References Cited

U.S. PATENT DOCUMENTS

| | | | |
|---|---|---|---|
| 4,342,814 A | | 8/1982 | Usuki et al. ................ 428/383 |
| 4,476,192 A | | 10/1984 | Imai et al. .................. 428/391 |
| 4,617,449 A | * | 10/1986 | Weitzel et al. ............... 392/469 |
| 5,075,514 A | * | 12/1991 | Hurd ....................... 174/117 F |
| 5,139,820 A | | 8/1992 | Sawada et al. .............. 427/120 |
| 5,166,477 A | | 11/1992 | Perin, Jr. et al. ............. 174/74 |
| 5,336,851 A | * | 8/1994 | Sawada et al. ........... 174/110 A |
| 5,410,106 A | * | 4/1995 | Nishino et al. .......... 174/105 R |
| 5,471,014 A | * | 11/1995 | Green .................... 174/124 R |
| 5,477,610 A | | 12/1995 | Sawada et al. ............... 29/282 |
| 5,612,510 A | * | 3/1997 | Hildreth ................ 174/120 SC |
| 5,725,953 A | | 3/1998 | Onishi et al. ................ 428/383 |
| 5,796,042 A | | 8/1998 | Pope ......................... 174/102 |
| 5,834,117 A | | 11/1998 | Onishi ........................ 428/379 |
| 5,902,681 A | | 5/1999 | Ueoka et al. ................ 428/383 |
| 6,159,055 A | * | 12/2000 | Satitpunwaycha et al. .... 439/700 |
| 6,429,377 B1 | * | 8/2002 | Polasky ................... 174/124 R |

OTHER PUBLICATIONS

C & M Corporation, Engineering Design Guide, (3rd Edition), Jan. 1992, pp. 2–8.*

* cited by examiner

Primary Examiner—William H. Mayo, III
(74) Attorney, Agent, or Firm—Moser, Patterson & Sheridan, LLP

(57) ABSTRACT

A high temperature cable includes wire bundle having a plurality of copper strands, where each copper strand has a barrier coating and an anti-oxidation coating disposed thereon. A mica-based layer is wrapped around a length of the wire bundle and a fiberglass layer is disposed over the mica-based layer.

28 Claims, 5 Drawing Sheets

US 6,875,927 B2

HIGH TEMPERATURE DC CHUCKING AND RF BIASING CABLE WITH HIGH VOLTAGE ISOLATION FOR BIASABLE ELECTROSTATIC CHUCK APPLICATIONS

FIELD OF THE INVENTION

The invention relates generally to an apparatus for providing power to a workpiece support within a semiconductor wafer processing system. More specifically, the invention relates to an improved DC chucking and RF biasing cable coupled to an electrostatic chuck for supporting and retaining semiconductor wafers.

BACKGROUND OF THE INVENTION

Electrostatic chucks are used for holding a workpiece in various applications ranging from holding a sheet of paper in a computer graphics plotter to holding a wafer within a semiconductor wafer processing chamber. Electrostatic chucks typically retain a workpiece (i.e., a semiconductor wafer) thereon, by creating an electrostatic attractive force between the wafer and the chuck. In particular, a voltage is applied to one or more electrodes in the chuck so as to induce oppositely polarized charges in the wafer and electrodes, respectively. The opposite charges provide an attraction force, which pulls the wafer against the chuck, thereby retaining the wafer.

In one type of wafer processing chamber, RF and chucking power has been provided to the one or more electrodes of the electrostatic chuck using a solid stainless steel rod, sequentially plated with copper, nickel, and gold. The solid copper plated rod is disposed though an insulating tube (e.g., fabricated from quartz), extending through the chamber to the chuck, where the solid copper plated rod is coupled to the chucking electrodes. However, the solid copper plated rod and quartz tube require an excessive amount of space within the shaft to accommodate the overall diameter of the tube to provide proper RF isolation. Furthermore, the solid copper plated rod is not flexible and the quartz tube is fragile and subject to being damaged during installation. As such, the manufacturing costs, parts replacement costs, and repair costs for a wafer processing chamber are driven higher.

Therefore, there is a need in the art for a high temperature resistant DC chucking and RF biasing cable having high RF voltage isolation.

SUMMARY OF THE INVENTION

The disadvantages associated with the prior art are overcome by the present invention of an apparatus and method for a high temperature cable. The high temperature cable includes a wire bundle having a plurality of copper strands, where each copper strand has a barrier coating and an anti-oxidation coating disposed thereon. A mica-based layer is wrapped around a length of the wire bundle and an insulative fiberglass layer is disposed around the mica-based layer.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

The invention relates to a wire design for an electrical power cable operating at high temperatures and capable of providing high direct current (DC) and radio frequency (RF) power with high RF isolation. For clarity and understanding the invention, the power cable is illustratively used to provide a DC chucking voltage and RF biasing power to one or more electrodes embedded in an electrostatic chuck for chucking and biasing semiconductor wafers in a semiconductor processing chamber. However, the electrical power cable of the present invention may be used for any apparatus requiring good conduction and RF isolation, and may be used at temperatures up to 1000° C.

Figure 1:
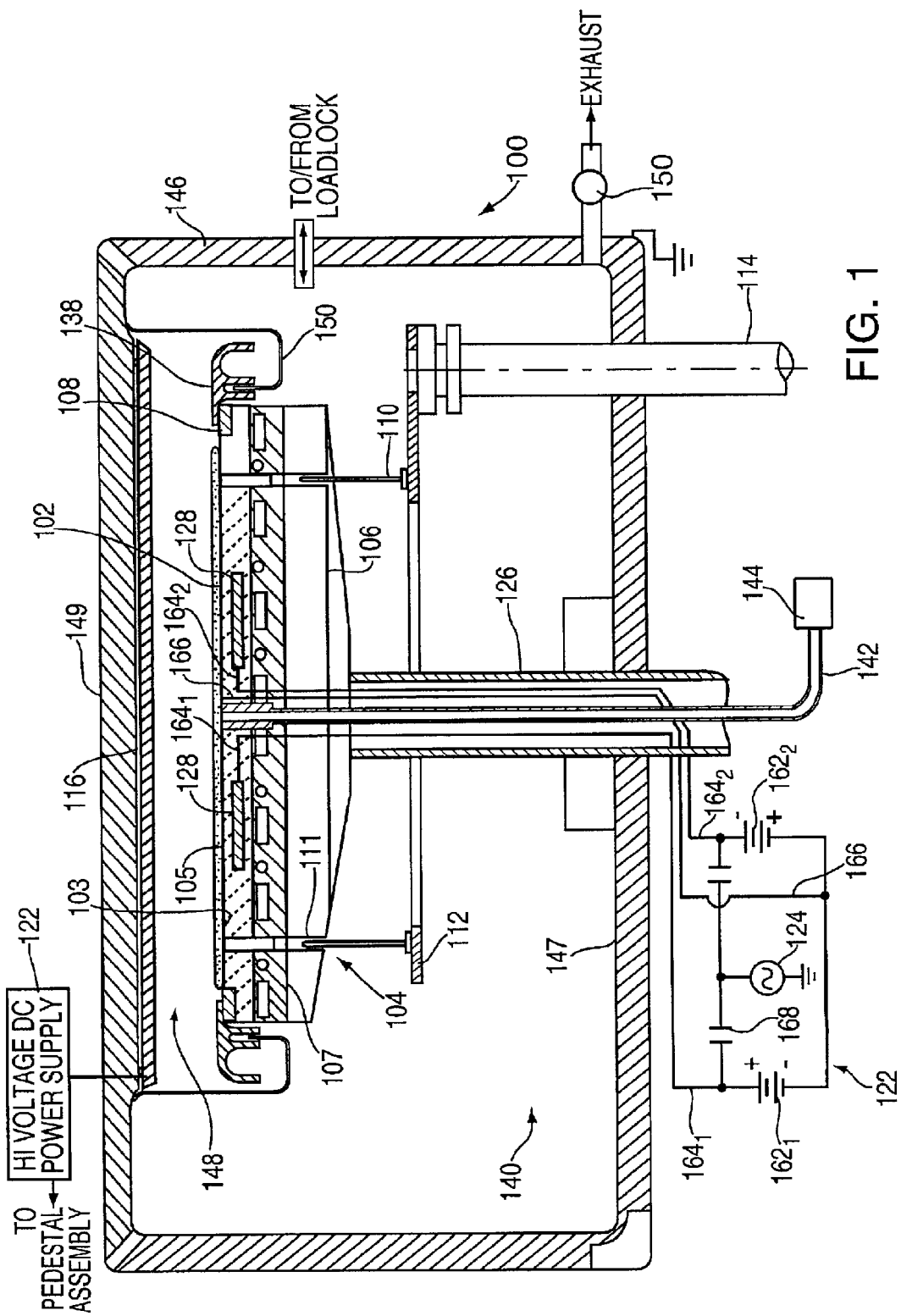
FIG. 1 depicts a partial cross-sectional view of a workpiece processing chamber housing the present invention.

FIG. 1 depicts a partial cross-sectional view of a semiconductor-processing chamber housing the cable of the present invention. In particular, FIG. 1 illustratively depicts a physical vapor deposition (PVD) processing chamber 100 for processing a workpiece 102 (i.e., a semiconductor wafer) in a workpiece processing system. Although the processing chamber is described in terms of a PVD chamber, the cable of the present invention may be utilized in any processing chamber, such as a chemical vapor deposition (CVD) chamber, an ion implanter, an etch chamber, or any other chamber requiring high power RF and DC signal transmission to a workpiece support, such as a biasable electrostatic chuck.

The processing chamber 100 comprises sidewalls 146, bottom portion 147, and a lid assembly 149. For a detailed understanding of the PVD processing chamber 100 and its operation in processing a wafer, the reader should refer to the drawings and the detailed description contained in commonly assigned U.S. Pat. No. 5,228,501, issued Jul. 20, 1993, U.S. patent application Ser. No. 09/691,655, filed Oct. 17, 2000, and U.S. patent application Ser. No. 09/881,979, filed Jun. 13, 2001, which are all incorporated herein by reference in their entireties. These disclosures describe 200 mm and 300 mm biasable wafer support assemblies used in physical vapor deposition chambers manufactured by Applied Materials, Inc. of Santa Clara, Calif.

The wafer 102 is disposed on a wafer support assembly 104 for retaining a wafer (e.g., 200 mm or 300 mm wafer) against the wafer support assembly 104, providing RF biasing to the wafer 102 in a well-defined and insulated path that is internal to the chamber 100, and operating in a temperature range of 400° C. to 4250° C. Specifically, the wafer 102 rests on a support surface 103 of the wafer support assembly 104. The wafer support assembly 104 comprises an electrostatic chuck (ESC) 105, supported by an ESC thermal control plate (e.g., heating and cooling plate) 107, pedestal base 106, and a shaft 126.

In one embodiment, the electrostatic chuck 105 is brazed to the thermal control plate 107. The thermal control plate 107 is disposed over and electron beam welded to the pedestal base 106, such that the electrostatic chuck 105, thermal control plate 107 and pedestal base 106 are non-detachable from one another. The electron beam welding is performed around the perimeter and between the thermal control plate 107 and the pedestal base 106, wherein an enclosure 208 is defined and maintained at an above vacuum pressurized environment. Alternately, the thermal control plate 107 is detachably coupled to the pedestal base 106 via a plurality of bolts (not shown). The shaft 126 is coupled to the bottom of the pedestal base 106 and communicates with the enclosure 208 (see FIG. 2), which together serve as a channel for connecting the various chuck assembly components to various external chamber components and sources (e.g., gas, coolant, electrical sources, process controllers, and the like).

The shaft 126 also houses the necessary plumbing conduits to provide a cooling fluid for cooling (not shown), as well as electrical wiring (not shown) for heating the thermal control plate 107. In particular, the shaft 126 houses a gas conduit 142 coupled to an external gas source 144 to provide a wafer backside gas (e.g., helium) between the wafer support surface 103 and the backside of the wafer 102. The shaft 126 also houses the necessary electrical wiring (i.e., electrode cables 164, and 1642) to provide DC power from remote DC power source 122 to the electrodes of the wafer support assembly 104. Additionally, a remote radio frequency (RF) voltage source 124 is also coupled to the wafer support assembly 104, via the electrode cables 164, for magnetron sputtering, as explained in greater detail below.

A plurality of lift pins 110, respectively extend through a plurality of lift pinholes 111, which extend through the electrostatic chuck 105, thermal control plate 107, and pedestal base 106. The lift pins 110 are mounted on a platform 112, which is connected to a vertical actuator 114. The actuator 114 serves to raise and lower the wafer 102 with respect to the support surface 103 during processing as required. A target 116 of sputtering or deposition material is positioned over the wafer support assembly 104. The target 116 is usually copper (Cu), tantalum (Ta), or titanium (Ti) and is electrically insulated from the chamber 100. In one embodiment, a waste ring 108, cover-ring 138, and shield 150 circumscribe the wafer support assembly 104 to prevent unwanted deposition into a lower chamber region 140.

Figure 2:
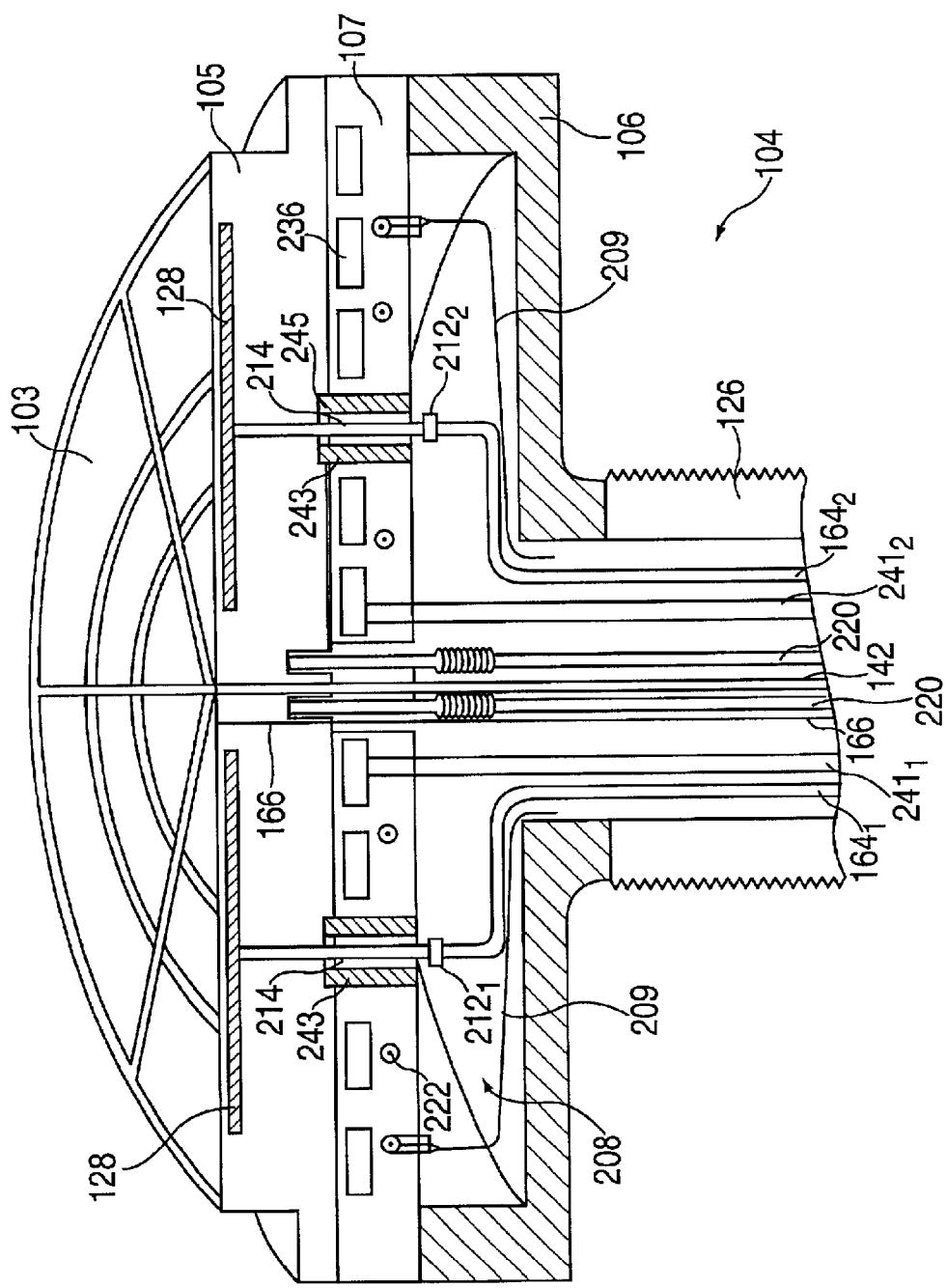
FIG. 2 depicts a partial perspective, cross-sectional view of a wafer support assembly of the present invention.

FIG. 2 depicts a partial perspective, cross-sectional view of the wafer support assembly 104 of FIG. 1. In particular, the pedestal base 106 is fabricated from stainless steel and shaped as a "dog dish". The electrostatic chuck 105 may be fabricated from a dielectric material e.g., a ceramic such as aluminum nitride (AlN), silicon nitride (SiN), boron nitride (BN), and the like, and is shaped as a thin circular puck. An example of a ceramic electrostatic chuck that may be used in this apparatus is disclosed in commonly assigned U.S. Pat. No. 5,656,093 issued Aug. 12, 1997 to Burkhart and is incorporated by reference herein. Specifically, that reference discloses a ceramic electrostatic chuck having a wafer spacing mask of metallic material deposited on the chuck surface 103.

Furthermore, the electrostatic chuck 105 may be provided with one or more chucking electrodes 128. The chucking electrodes 128 are also fabricated from a conductive material, (e.g., tungsten, molybdenum, and the like). The chucking electrodes 128 are disposed relatively close to the top surface 103 of the electrostatic chuck 105. In this way, the chucking electrodes 128 provide the necessary electrostatic force to the backside of a workpiece (not shown in FIG. 2A) to retain it on the electrostatic chuck 105. The chucking electrodes 128 may be in any configuration necessary to retain the wafer 102 upon the chuck 105. For example, the chucking electrodes 128 may be in a monopolar configuration, bipolar configuration, or zoned chucking configuration, among others. In the embodiment of FIGS. 1 and 2, the chucking electrodes have a bipolar configuration. The chucking electrodes 128 are also connected to a remote power source, i.e. high voltage DC (HVDC) power supply 122. In addition and preferably, the chucking electrodes also serve as biasing electrodes. In particular, the remote RF power source 124 superimposes RF power on the electrodes 128 to create a biasing voltage. An example of an electrostatic chuck having a pair of electrodes embedded therein, where the pair of electrodes are coupled to a DC chucking voltage and RF biasing power is seen and described in co-owned and assigned U.S. Pat. No. 5,886,866, issued Mar. 23, 1999, and is herein incorporated by reference in its entirety.

In one embodiment, the thermal control plate 107 has a diameter at least the same as the electrostatic chuck 105 and comprises various components that assist in regulating the temperature over the entire area of the support surface 103 of the electrostatic chuck 105. The thermal control plate 107 may be fabricated from molybdenum, a zirconium alloy such as the commercially available grade 702-zirconium alloy comprising Zr-Hf, a metal matrix composite such as Al-Si-SiC, a molybdenum/KOVAR® composite, where KOVAR® is the trade name for an iron/nickel/cobalt alloy manufactured and sold by Westinghouse Electric Co., and the like.

The thermal control plate 107 provides temperature regulation of the electrostatic chuck 105. The thermal control plate 107 illustratively comprises a cooling channel 236 extending radially outward in a coil like manner. A pair of coolant supply conduits 241, and 2412 (collectively coolant supply conduits 241) is coupled to the cooling groove 236 and extend down through the shaft 126 to a remote cooling source (not shown) to provide a forward and return path for a coolant (e.g., water) to the thermal control plate 107. The thermal control plate 107 may further comprise a heater electrode 222 extending radially outward in the thermal control plate 107 in a coil like manner. Additionally, a pair of thermocouples 220 electrically coupled to a controller (not shown) may extend through the shaft 126 and the thermal control plate 107 to the chuck 105, to provide temperature measurements for dynamically controlling the processing temperatures by either increasing or decreasing the temperature of the thermal control plate 107. An example of a thermal control plate 107 is seen and described in co-owned and assigned U.S. patent application Ser. No. 09/881,979, filed Jun. 13, 2001, and is incorporated by reference herein in its entirety.

In the illustrative bipolar electrode configuration shown in FIGS. 1 and 2, a pair of electrode cables $164_1$ and $164_2$ electrically couples the DC chucking power source 122 and RF power source 124 to the pair of electrodes 128. Each electrode cable 164 is rated to provide a DC voltage and current of 6K volts DC and 10 amps. Additionally, each electrode cable 164 is rated to provide a RF voltage and current of OK volts AC and 15 amps in a frequency range of 400 kHz to 20 Mhz. Preferably, during normal semiconductor operation, the electrode cables provide respective DC chucking voltages and current of 1000 volts DC and 10 milliamps DC, and respective RF biasing voltages and current of 1000 volts AC and 20 amps at a frequency of 12.56 MHz.

Figure 3A:
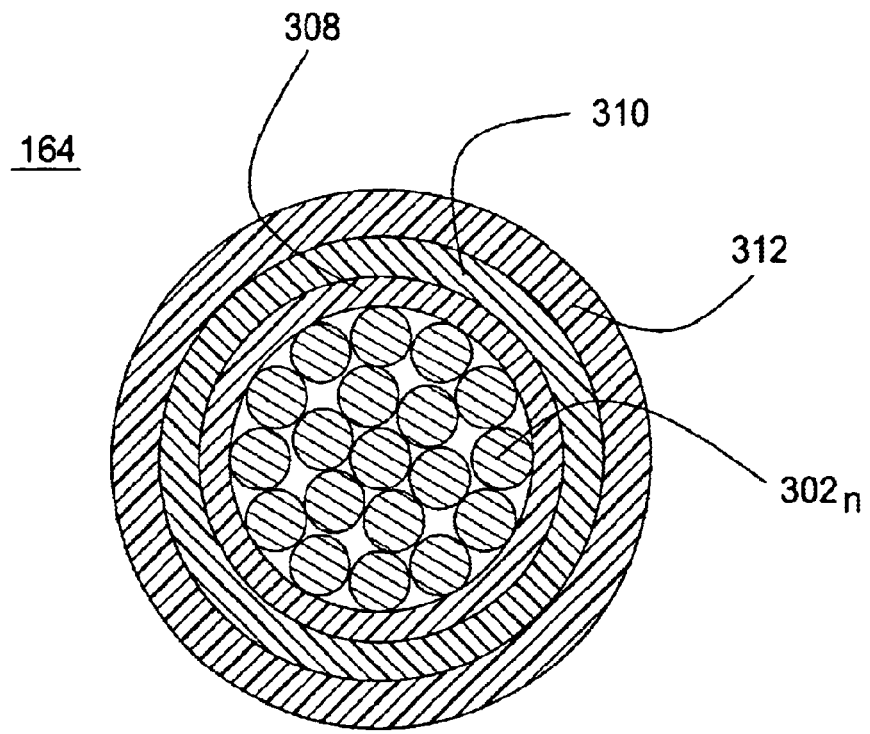
FIG. 3A depicts a cross-sectional view of the electrode cable of the present invention.
Figure 3B:
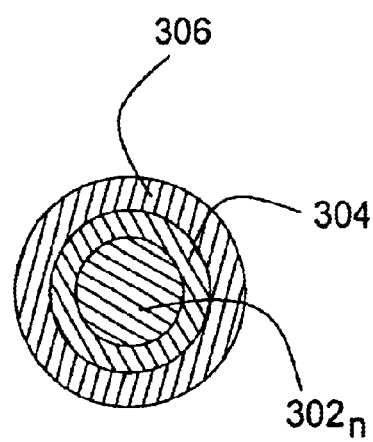
FIG. 3B depicts a cross-sectional view of a single strand of wire of the electrode cable of FIG. 3A.
Figure 4:
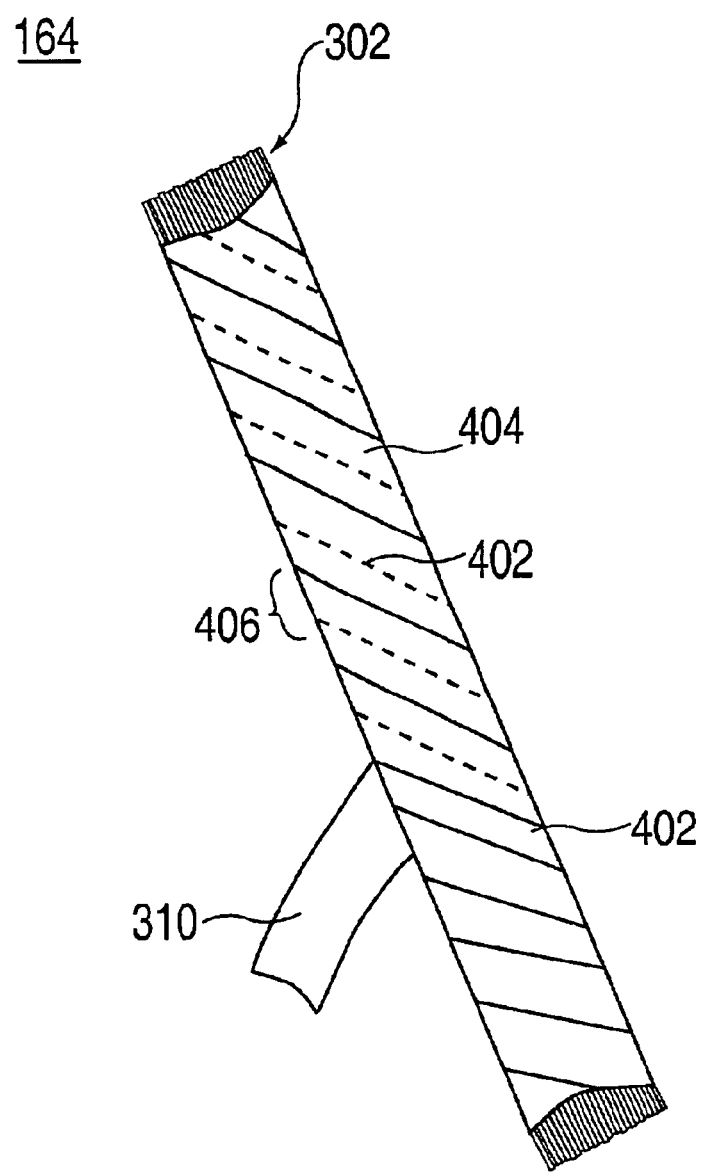
FIG. 4 depicts a perspective view of the electrode cable of the present invention.
Figure 5:
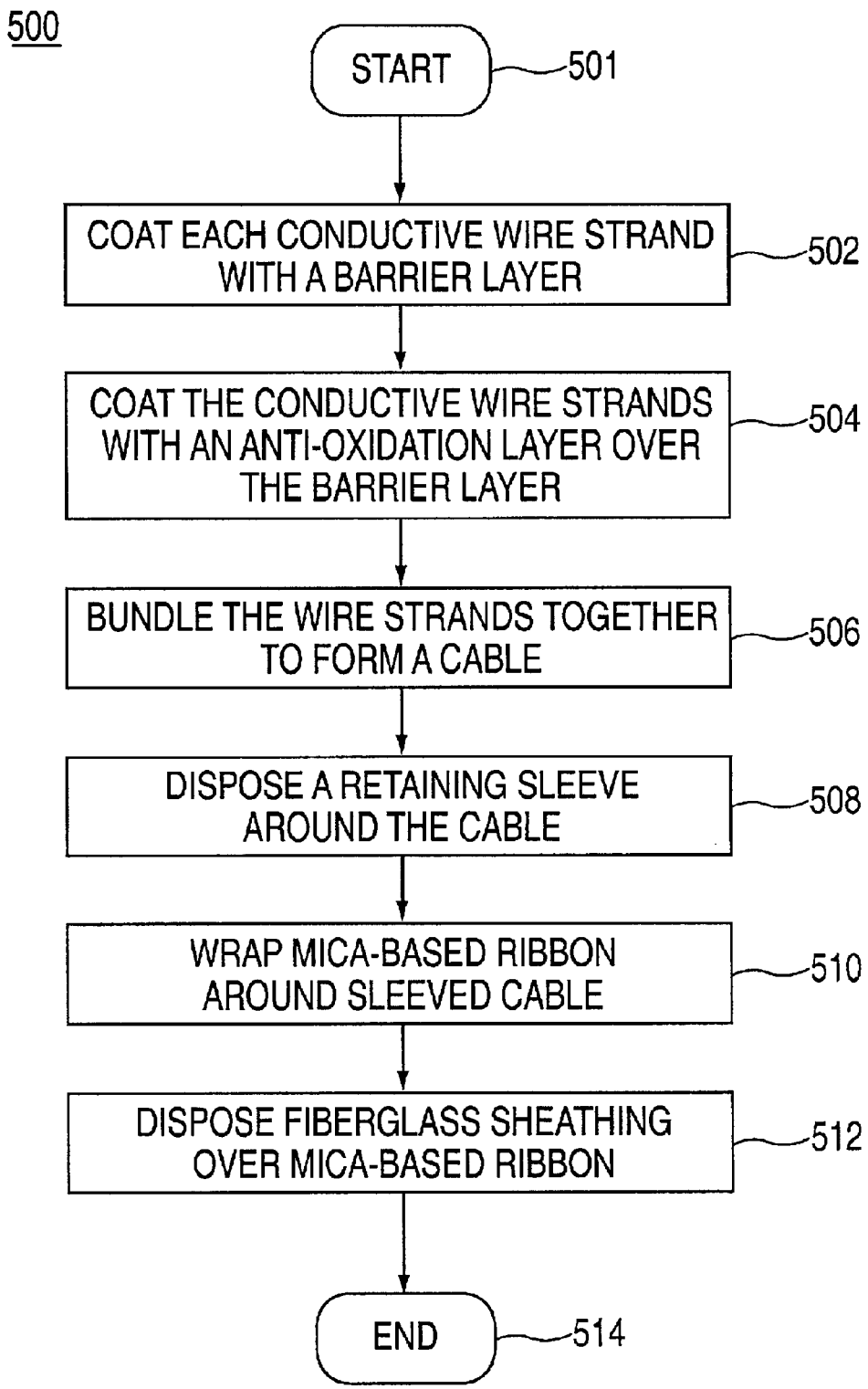
FIG. 5 depicts a flow chart of a method of fabricating the electrode cable of the present invention.

FIG. 3A depicts a cross-sectional view of an electrode cable 164 of FIG. 1 of the present invention. FIG. 3B depicts a cross-sectional view of a single strand of wire of the electrode cable 164 of FIG. 3A. FIG. 4 depicts a perspective view of the electrode cable 164, and FIG. 5 depicts a flow chart of a method 500 of fabricating the electrode cable 164 of the present invention. FIGS. 3A, 3B, and 4 should be viewed in conjunction with FIG. 5. Referring to FIGS. 3A and 3B together, the electrode cable 164 comprises a plurality of wire strands 302 fabricated from a conductive material such as copper, where each strand $302_n$ (where n is an integer) is sequentially coated with a barrier coating 304 and then coated with a conductive anti-oxidizing coating 306. In one embodiment, each copper strand 302 has a diameter of 20.101 mils (American Wire Gauge (AWG) number 24 or 0.511 mm), where 1 mil equals 0.001 inch.

The method 500 starts at step 501 and proceeds to step 502, where each strand of conductive wire (e.g., copper) 302 is coated with a barrier layer 304. The barrier coating 304 is provided between the copper strands 302 and anti-oxidizing coating 306 to prevent diffusion of the gold coating into the copper strands 302. In one embodiment, the barrier coating 304 is nickel. Alternately, palladium or rhodium may be used as barrier coatings 304 over the copper strands 302. The barrier coating 304 covering each copper strand 302 has a thickness that enables full coverage over the strands to prevent oxidation of the copper strands 302. In one embodiment, the barrier coating 304 has a thickness of at least 50 micro-inches.

At step 504, an anti-oxidation coating 306 is coated over the barrier layer 304. The anti-oxidizing coating 306 is, for example, gold and prevents oxidation of the copper strands 302 at high temperatures, as well as providing RF current conduction. The anti-oxidizing coating 306 covering the barrier coating 304 has a thickness necessary to prevent oxidation at high temperatures. In one embodiment, the anti-oxidizing coating is approximately 50 micro-inches, and the method 500 proceeds to step 606.

At step 506, the conductive portion of the electrode cable 164 is formed by bundling a plurality of strands 302 (each with their respective barrier and conductive coatings 304 and 306 thereon) together. In one embodiment, 19 copper strands 302 are bundled together to form a substantially circular cross-section, stranded copper core cable, which has an aggregate diameter of approximately 80.807 mils (AWG number 12). The bundled copper strands 302 are flexible, as opposed to using a solid copper rod as a conductive core. As such, the electrode cable 164 is flexible, and may be easily routed through the shaft 126 and enclosure 208 for physical coupling to the electrodes 128 as discussed below.

Although the invention is discussed in terms of 19 strands, such number of strands is not considered as limiting, and any number of strands 302 may be utilized in accordance with design considerations.

Once the illustrative 19 copper strands 302 (each having the barrier and anti-oxidation coatings 304 and 308 provided thereon) are bundled together, at step 508, a retaining sleeve 308 is provided around the circumference of the bundled plurality of copper strands 302 to retain (secure) the bundled copper strands 302 together for further processing as discussed below. The retaining sleeve 308 may be fabricated from a dielectric, polymer, or fluoropolymer material (e.g., TEFLON™).

At step 510, a first insulative layering (e.g., layer 310) is provided over the bundled cable (and retaining sleeve) to electrically and thermally isolate the conductive strands 302. In particular, a first insulation layer 310 is a high temperature resistant mica-based insulation material, such as FIROX®, manufactured by Cogebi, Inc., of Dover, N.H. The mica-based insulation layer 310 illustratively comprises phlogopite mica paper impregnated with high temperature resistant silicon elastomer, and bonded to either an electrical grade glass cloth or polyethylene film as the supporting fabric. The mica-based insulative layer 310 is formed as flexible tapes, sheets, or ribbons. A person skilled in the art will recognize that other mica-based insulation layer materials, which are resistant to high temperatures, may also be utilized.

At step 510, the mica-based insulation layer 310 (i.e., ribbons) is wrapped around a length of the bundled copper strands 302. The sheets of mica ribbon have a thickness in a range of 0.1 mm to 0.14 mm, and preferably a thickness of 0.125 mm. Referring to FIG. 4, a first layer 402 of the mica ribbon 310 is wound around the circumference of the bundled strands 302 (and retaining sleeve 308), where the wound mica ribbon 310 is partially overlapped 406 with each pass around the bundled strands 302. That is, a second layer 404 of the mica ribbon 310 is wound around the first layer 402. The mica ribbon 310 may be wrapped around the bundled strands 302 multiple times such that the first layer 402 of wrapped mica ribbon 310 has been completely overlapped 406 by additional wrappings. In one embodiment, the mica ribbon 310 is wrapped three times with a 50% overlap of each layer (e.g., layers 402 and 404) to ensure complete insulative coverage around the bundled copper strands 302.

At step 512, a second insulation layer 312, fabricated from fiberglass braids, is disposed over the sheets of mica along the length of the bundled copper strands 302. The fiberglass layer 312 serves as a binder used to secure and protect the mica ribbon 310, which may be susceptible to flaking apart and producing undesired contaminants under certain conditions. Together, the mica-based insulative layer 310 and fiberglass insulative layers 312 provide 6 KV RF isolation and is rated for temperatures as high as 1000° C. The method 500 then proceeds to step 514, where the method 500 ends.

Referring to FIG. 2, each electrode cable 164 passes through the shaft 126 and enclosure 208 in the pedestal 106, and is coupled to an electrode feedthrough 214. The electrode feedthrough 214 is physically and electrically coupled to each electrode 128 and extends through a bore 243 in the thermal control plate 107 and electrostatic chuck 107. Furthermore, each electrode lead bore 243 comprises an insulating sleeve 245 such as alumina ($AlO_3$) to isolate the respective electrode feedthroughs 214. The electrode cables 164 have a terminal $212_1$ and $212_2$ (collectively terminals 212) disposed on an end proximate the electrode feedthroughs 214. The terminals 212 may be coupled to the electrode cable 164 in any manner that provides a secure means of coupling the cable to a feedthrough 214. In one embodiment, the terminals 212 are crimped around the cables 164. In a second embodiment, the terminals 212 are provided with a socket (not shown), in which the cable 164 is seated and secured with a tapping or set-screw. Each terminal 212 is then coupled (e.g., screwed, soldered, crimped, and the like) to an end of the feedthrough 214 projecting from the bore 243 of the thermal control plate 107.

Referring to FIG. 1, the HVDC power supply 122 illustratively comprises a pair of dual terminal DC voltage supplies $162_1$ and $162_2$ (collectively DC voltage supplies 162) having a center tap 166. The pair of DC voltage supplies 162 provide up to 1000 VDC. Each DC voltage supply 162 is coupled to an electrode 128 via a respective pair of electrode wires or cables 164. A cathode on one of the pair of voltage supplies 162 (e.g., voltage supply 162₁) is coupled via the electrode cable 164, to one of the bipolar chucking electrodes 128, and the anode of the other voltage supply 162 (e.g., voltage supply 162₂) is coupled via the electrode cable 1642 to the other bipolar chucking electrode 128. The center tap 166 is coupled to the support surface 103 of the electrostatic chuck 105. As such, variations in the distance between the wafer and electrodes due to variations in dielectric thickness, wafer backside roughness, chuck surface roughness, chuck surface conductivity, or other physical variations that may cause changes in the electrostatic force, are balanced by having the support surface 103 (e.g., minimum contact area spacing mask (not shown)) connected to the center tap 166 of the power supply 122. As such, each electrode cable 164 is coupled to a respective bipolar chucking electrode 128. Alternately, where a monopolar electrode 128 is embedded in the electrostatic chuck 105, a single DC voltage supply 162 and electrode cable 164 is coupled to the electrode 128.

Furthermore, the RF voltage source 124 is capable of providing RF voltage and current signals of 1000 volts and 20 amps at a preferred frequency of 12.56 MHz. The RF voltage source 124 is coupled to the electrode cables 164 via pass through capacitors 168 to superimpose the RF signal onto the electrodes 128. Thus, the electrodes 128 receive a DC voltage from the DC voltage supply 122 and a RF voltage from the RF voltage source 124 to provide chucking and biasing of the wafer 102.

When RF power is applied to the electrode cables 164, the voltage induced inside the conductor, which opposes the applied voltage, becomes sufficiently large to force the current to distribute itself so that the greater proportion flows near the surface (i.e., the outer gold conductor and the copper strands 302 positioned on the periphery of the bundle) of the cable 164, commonly known as the 'skin effect'). Coincidentally, while the DC voltage source 122 is used to provide an electrode chucking voltage, a low amount of DC current (e.g., approximately 10 milliamps) is generated. Moreover, the electrode cables 164 have a RF isolation value of approximately 6 KV. Therefore, any other electrical wiring (e.g., heater wiring) passing through the shaft 126 is not detrimentally subject to the high RF signals of the electrode cables 164.

The electrode cables 164 of the present invention reduce the complexity of the wafer support assembly 104. In particular, the electrode cables 164 have an overall diameter that is less than the solid conducting rod and quartz shaft currently utilized in conventional electrostatic chucks. As such, the fragile quartz tube, which was subject to damage during assembly, is no longer required. In addition, the electrode cables 164 are flexible, which facilitates ease of running the cables 164 through the shaft 126 and enclosure 208 and then couple each cable 164 a respective electrodes 128. Moreover, the electrode cables 164 are highly resistant to the effects of oxidation at high temperatures.

In operation, a wafer 102 is placed on the support surface 103 of the electrostatic chuck 105. Air is drawn out of the chamber 100 via a vacuum pump 150 to create a low-pressure environment (i.e. 1 mT −5 Torr). A reactant gas, preferably Argon, is introduced into the chamber 100 from the remote gas source 144, which is connected to a second end of the gas conduit 142 (see FIG. 1). The power supply 122 is energized which electrostatically clamps the wafer 102 to the support surface 103. Specifically, the power supply 122 applies a DC bias to the chucking electrodes 128. Additionally, the high RF voltage signal produced by the RF power supply 124 negatively biases the target 116, thereby igniting the gas into a plasma, and then causing the target material to sputter onto the wafer 102.

Although various embodiments that incorporate the teachings of the present invention have been shown and described in detail herein, those skilled in the art may readily devise many other varied embodiments that still incorporate these teachings.

What is claimed is:

1. A high temperature cable, comprising:
    a wire bundle having a plurality of conductive strands, each conductive strand having a barrier coating and an anti-oxidation coating disposed thereon;
    a mica-based layer disposed around the wire bundle; and
    a fiberglass layer disposed around the mica-based layer.

2. The cable of claim 1, wherein the barrier coating is a material selected from the group consisting of nickel, palladium, and rhodium.

3. The cable of claim 1, wherein the barrier coating has a thickness of at least 50 micro inches.

4. The cable of claim 1, wherein the anti-oxidation coating is gold.

5. The cable of claim 1, wherein the anti-oxidation coating has a thickness approximately 50 micro inches.

6. The cable of claim 1, wherein the plurality of conductive strands comprises 19 copper strands, wherein each strand has a diameter of 0.0201 inches.

7. The cable of claim 1, further comprising a retaining sleeve disposed around the wire bundle.

8. The cable of claim 7, wherein the retaining sleeve comprises a material selected from the group consisting of a dielectric, a polymer, and a fluoropolymer.

9. The cable of claim 1, wherein the cable has an RF isolation rating of 6 KV.

10. The cable of claim 1, wherein the cable has a temperature rating of 1000° C.

11. A semiconductor wafer support apparatus, comprising:
    an electrostatic chuck having at least one electrode embedded therein;
    a pedestal support coupled to the electrostatic chuck;
    a shaft coupled to the pedestal; and
    at least one electrode cable respectively coupled to the at least one electrode and adapted for connection to provide DC and RF power to the at least one electrode, wherein the at least one electrode cable comprises:
        a wire bundle having a plurality of conductive strands, each conductive strand having a barrier coating and an anti-oxidation coating disposed thereon;
        a mica-based layer disposed around the wire bundle; and
        a fiberglass layer disposed around the mica-based layer.

12. The apparatus of claim 11, wherein the barrier coating is a material selected from the group consisting of nickel, palladium, and rhodium.

13. The apparatus of claim 11, wherein the barrier coating has a thickness of at least 50 micro inches.

14. The apparatus of claim 11, wherein the anti-oxidation coating is gold.

15. The apparatus of claim 11, wherein the anti-oxidation coating has a thickness of approximately 50 micro inches.

16. The apparatus of claim 11, wherein the plurality of conductive strands comprises 19 copper strands, wherein each strand has a diameter of 0.0201 inches.

17. The apparatus of claim 11, further comprising a retaining sleeve disposed around the wire bundle.

18. The apparatus of claim 17, wherein the retaining sleeve comprises a material selected from the group consisting of a dielectric, a polymer, and a fluoropolymer.

19. The apparatus of claim 11, wherein the cable has an RF isolation rating of 6 KV.

20. The apparatus of claim 11, wherein the cable has a temperature rating of 1000° C.

21. The apparatus of claim 11, wherein the electrostatic chuck operates at a temperature in a range of −20° C. to 450° C.

22. A method of fabricating a high temperature resistant cable for transmitting DC and RF signals, comprising:
    coating a plurality of conductive strands with a barrier layer;
    coating the plurality of conductive strands and the barrier layer with an anti-oxidation layer;
    forming the plurality of conductive strands into a wire bundle;
    providing a mica-based layer around a length of the wire bundle; and then
    sheathing the mica-based layer in a fiberglass layer.

23. The method of claim 22, wherein the barrier coating is a material selected from the group consisting of nickel, palladium, and rhodium.

24. The method of claim 22, wherein the anti-oxidation coating is gold.

25. The method of claim 22, wherein the forming step further comprises forming 19 copper strands each having a diameter of 0.0201 inches into a substantially circular wire bundle.

26. The method of claim 22, wherein the forming step further comprises providing a retaining sleeve around the wire bundle prior to providing the mica-based layer.

27. The method of claim 26, wherein the providing the mica-based layer comprises wrapping the mica-based layer around the length of the wire bundle, and the wrapping step further comprises winding mica ribbon around the circumference of the bundled strands and retaining sleeve, such that the wound mica ribbon is partially overlapped with each pass around the bundled strands.

28. The method of claim 27, wherein said winding step further comprises wrapping the mica ribbon three times with 50% overlap around the bundled conductive strands.

* * * * *

UNITED STATES PATENT AND TRADEMARK OFFICE
CERTIFICATE OF CORRECTION

PATENT NO. : 6,875,927 B2
APPLICATION NO. : 10/095351
DATED : April 5, 2005
INVENTOR(S) : Brown et al.

It is certified that error appears in the above-identified patent and that said Letters Patent is hereby corrected as shown below:

In column 2, line 59, delete "400° C. to 4250° C." and insert - - -40° C. to 425° C. - -, therefor.

In column 3, line 24 (Approx.), delete "164," and insert - - $164_1$ - -, therefor.

In column 3, line 24 (Approx.), delete "1642)" and insert - - $164_2$) - -, therefor.

In column 4, line 34, delete "241," and insert - - $241_1$ - -, therefor.

In column 4, line 34, delete "2412," and insert - - $241_2$ - -, therefor.

In column 4, line 59, delete "OK" and insert - - 6K - -, therefor.

In column 5, line 37 (Approx.), delete "606." and insert - - 506. - -, therefor.

In column 5, line 55, delete "308" and insert - - 306 - -, therefor.

In column 7, line 2, delete "164," and insert - - $164_1$ - -, therefor.

In column 7, line 5, delete "1642" and insert - - $164_2$ - -, therefor.

In column 7, line 35-36 (Approx.), delete "'skin effect')." and insert - - "skin effect"). - -, therefor.

Signed and Sealed this

Eighth Day of August, 2006

JON W. DUDAS
*Director of the United States Patent and Trademark Office*